United States Patent [19]
Gleichert et al.

[11] Patent Number: 5,250,913
[45] Date of Patent: Oct. 5, 1993

[54] VARIABLE PULSE WIDTH PHASE DETECTOR

[75] Inventors: Marc C. Gleichert; Thomas Korn, both of San Jose, Calif.

[73] Assignee: Advanced Micro Devices, Inc., Sunnyvale, Calif.

[21] Appl. No.: 839,868

[22] Filed: Feb. 21, 1992

[51] Int. Cl.$^5$ .............................................. H03L 7/089
[52] U.S. Cl. ...................................... 331/25; 331/1 A; 331/17; 307/602; 307/603; 375/120
[58] Field of Search .................. 331/1 A, 17, 23, 25; 329/307, 325, 360; 375/120; 307/602, 603, 605

[56] References Cited

U.S. PATENT DOCUMENTS 4,590,602  5/1986  Wolaver ........................... 375/120
4,884,041  11/1989  Walker ............................. 331/57

OTHER PUBLICATIONS

*Electronics Letters*, vol. 22, No. 12, Jun. 5, 1986, pp. 677-679, Syed, K. E. et al; "Gigahertz Voltage-Controlled Ring Oscillator".

*Primary Examiner*—David Mis
*Attorney, Agent, or Firm*—Gerald Fisher

[57] ABSTRACT

A phase detector (1) for a phase locked loop (PLL) for bit clock retrieval where the phase detector employs a plurality of variable unit delays (20,21) and has a constant gain region that is a percentage of the clock period over an extended frequency range of the VCO enabling a single (PLL) chip to operate for several applications at widely different frequencies.

11 Claims, 5 Drawing Sheets

VARIABLE PULSE WIDTH PHASE DETECTOR

FIELD OF THE INVENTION

The present invention relates to phase detectors and more particularly to a phase detector for data recovery systems employing a variable frequency voltage controlled oscillator in a phase locked loop.

BACKGROUND OF THE INVENTION

It is known that serial digital data communication receivers must be synchronized to the incoming serial data rate in order to properly recover the data. A circuit called a phase locked loop has been employed for this purpose. A phase locked loop is responsive to the data rate of the incoming serial data, and compares the timing of said incoming data to a clock pulse being generated by a voltage controlled oscillator (VCO) in the receiver. Whenever any difference in frequency or phase between these two signals is sensed, a phase error signal is generated which is used to resynchronize the VCO. Extreme stability, accuracy and speed of response to correct the VCO has become more important for the higher communications data rate of the fiber and microwave links. Several of these different types of communication links employ different data rates such as ESCON at 200 MHz and Fibre Channel Specification (ANSI X3T9.3) at 266.7 MHz. The portion of the phase locked loop which compares the incoming serial data to the VCO is called a phase detector. Prior art phase detectors could not be optimally operated over the wide frequency ranges of these applications and therefore required a different design for each application. The range of the prior art phase detectors was sensitive to frequency and pulse width so that they could not reliably operate at both the high and low frequencies in the frequency range of interest. Also, the acquisition frequency, i.e., the frequency over which lock could be reacquired if it were lost during operation, was limited.

It is the object of our invention to provide a novel phase shifter and a phase detection method and a phase detector having a constant gain region which is a fixed percentage of the period over the operative frequency range.

SUMMARY OF THE INVENTION

The above mentioned objectives are accomplished employing constant gain phase detection circuit having a wider constant gain region which is easy to implement in an integrated circuit form.

A feature of invention is the use of a plurality of the identical unit delay cells which are controllable by an analogue voltage.

A still further feature of my invention is the large range of frequencies over which it is operable.

DETAILED DESCRIPTION OF THE INVENTION

Figure 1:
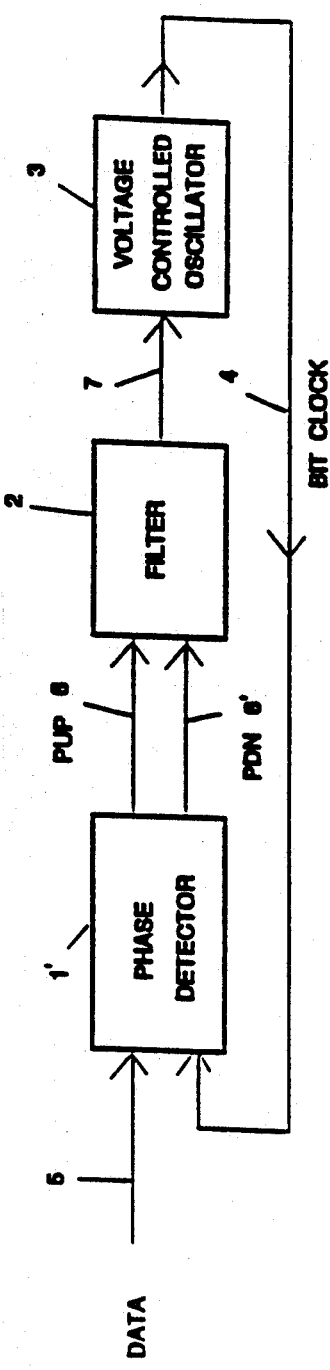
FIG. 1 is a block diagram of prior art phase locked loops.

With reference to FIG. 1, a simplified block diagram of a prior art phase locked loop is disclosed showing the phase detector 1' comparing the incoming serial data bit stream 5 to the bit clock from voltage controlled oscillator 3 on feedback connection 4. The phase detector develops a pair of control signals PUP and PDN which it sends to a low pass filter 2 via lines 6 and 6'. PUP and PDN stand for pump up and pump down which terms relate to charging a capacitor which stores the voltage to control the VCO. Output of the filter 2 on line 7 is sent to the VCO 3, to control it. Many schemes have been employed in the prior art and in general, the width of the constant gain region of the phase detectors, either in phase or amplitude were not constant as a function of frequency.

Figure 2:
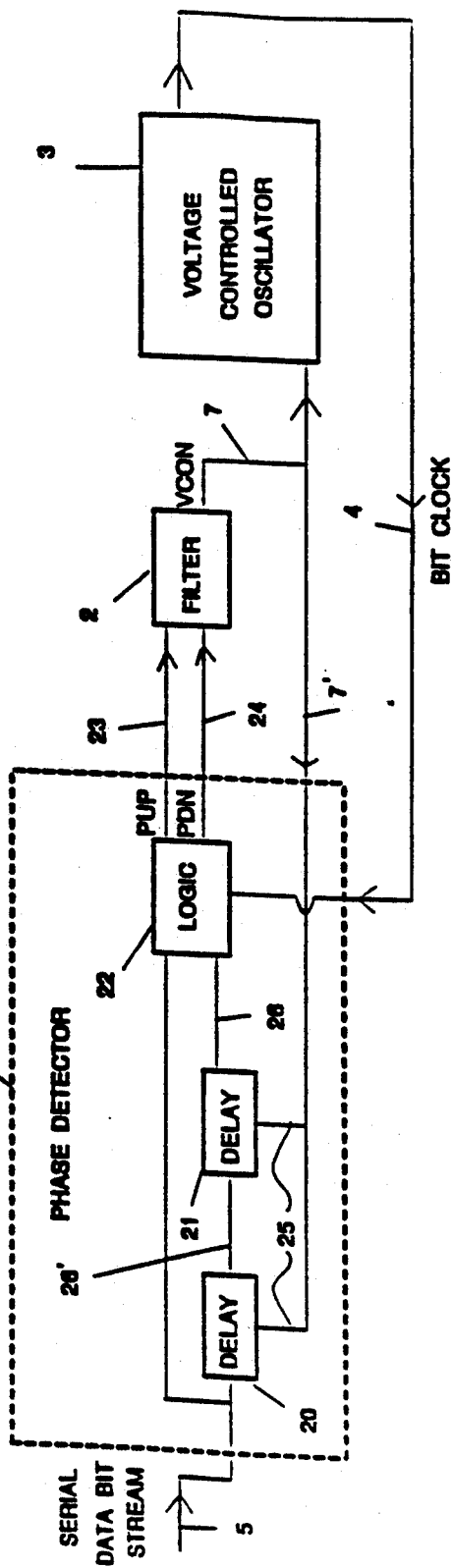
FIG. 2 is a block diagram of the phase locked loop of our invention.

A block diagram of our novel phase detector 1, with reference to FIG. 2, is seen to include a pair of serially connected unit delays 20 and 21. The outputs 26 of the unit delay 21 is connected to the phase detector logic circuit 22. The output 26' of unit delay 20 is connected to the input of unit delay 21. The bit clock from VCO 3 is also connected to the phase detector logic circuit on line 4. The analogue output VCON, of the filter 2, in addition to the prior art connection 7 to the VCO, is sent via conductor 7' to the unit delays 20 and 21 on lines 25 to control their operation as will be explained subsequently. The outputs of the logic 22 are the outputs pump up (PUP) 23 and pump down (PDN) 24 connected to filter 2 as in the prior art.

Figure 3:
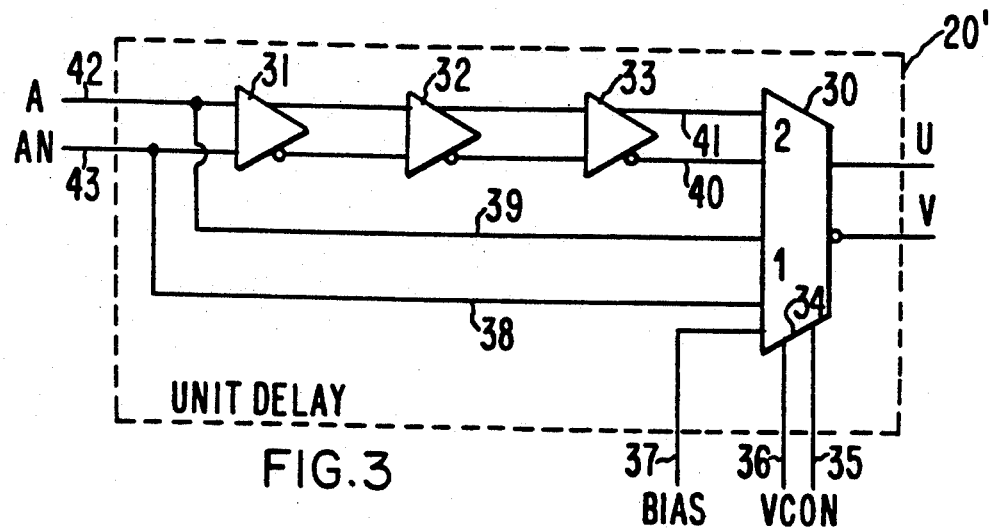
FIG. 3 is a schematic of a unit delay of our invention.
Figure 4:
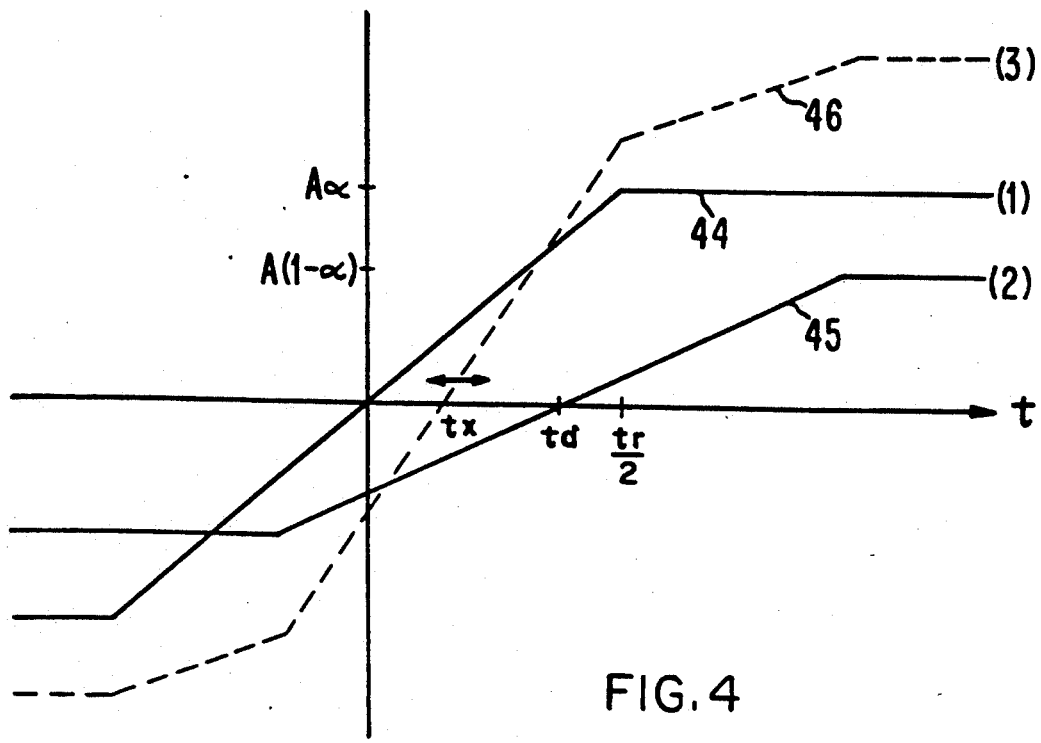
FIG. 4 are curves explanatory of the function of the unit delay of FIG. 3.

With reference to FIG. 3 and FIG. 4, are disclosed the circuit block diagram of one half of the unit delay circuits 20 and 21 and the wave forms descriptive thereof. The box 30 is shown using a multiplexor symbol because the circuit in the box 30 performs a weighted addition of its inputs on input port 2 and input port 1 with the weight determined by the analogue feedback voltage VCON from the filter 2 applied to differential input 34. FIG. 4 shows how the weighting affects the overall delay of the unit delay circuit 20. FIG. 4 is an example and is drawn with the assumption that graphs 44 and 45 are the wave forms of data at the input ports 2 and 1 of the weighter/adder 30. Along the time axis, $t_d$ is the delay difference between weighter/adder ports inputs and $t_r$ is the rise time 0–100% of the data at port 1. The weighter/adder 30 as will be explained more fully subsequently, combines the voltage from ports 1 and 2 responsive to the analogue feedback VCON. The weighter/adder provides the function of multiplying the voltages at its two ports by a different factor and adding the result. Each port input contributes to the addition curve shown in graph 46 but the weighting multiplies the voltage at port one by $A\alpha$ and the voltage at port 2 by $A(1-\alpha)$ and then adds them together forming the addition curve shown in line 46. Assuming that A is a constant and $\alpha$, the weighting factor or modulation constant, satisfies $0 \leq \alpha \leq 1$, with reference to FIG. 4, it can be shown that:

$$V_1 = \frac{2A\alpha t}{t_r} \qquad 1.$$

-continued $$V_2 = \frac{2A(1-a)t}{t_r} - A(1-a)\frac{2t_d}{t_r} \qquad 2.$$

$$V_3 = V_1 + V_2 = \frac{2At}{t_r} - A(1-a)\frac{2t_d}{t_r} \qquad 3.$$

Solving for t when $V_3 = 0$ $$t_x = (1-a)t_d \qquad 4.$$

Equation (4) shows that $t_x$ is a linear function of the modulation constant, $a$, of the weighter/adder and that the slope of the rising edge of the combined curve is a combination of the voltage rise times at ports 1 and 2. This provides a variable delay depending on the value of the weighting factor.

Figure 5:
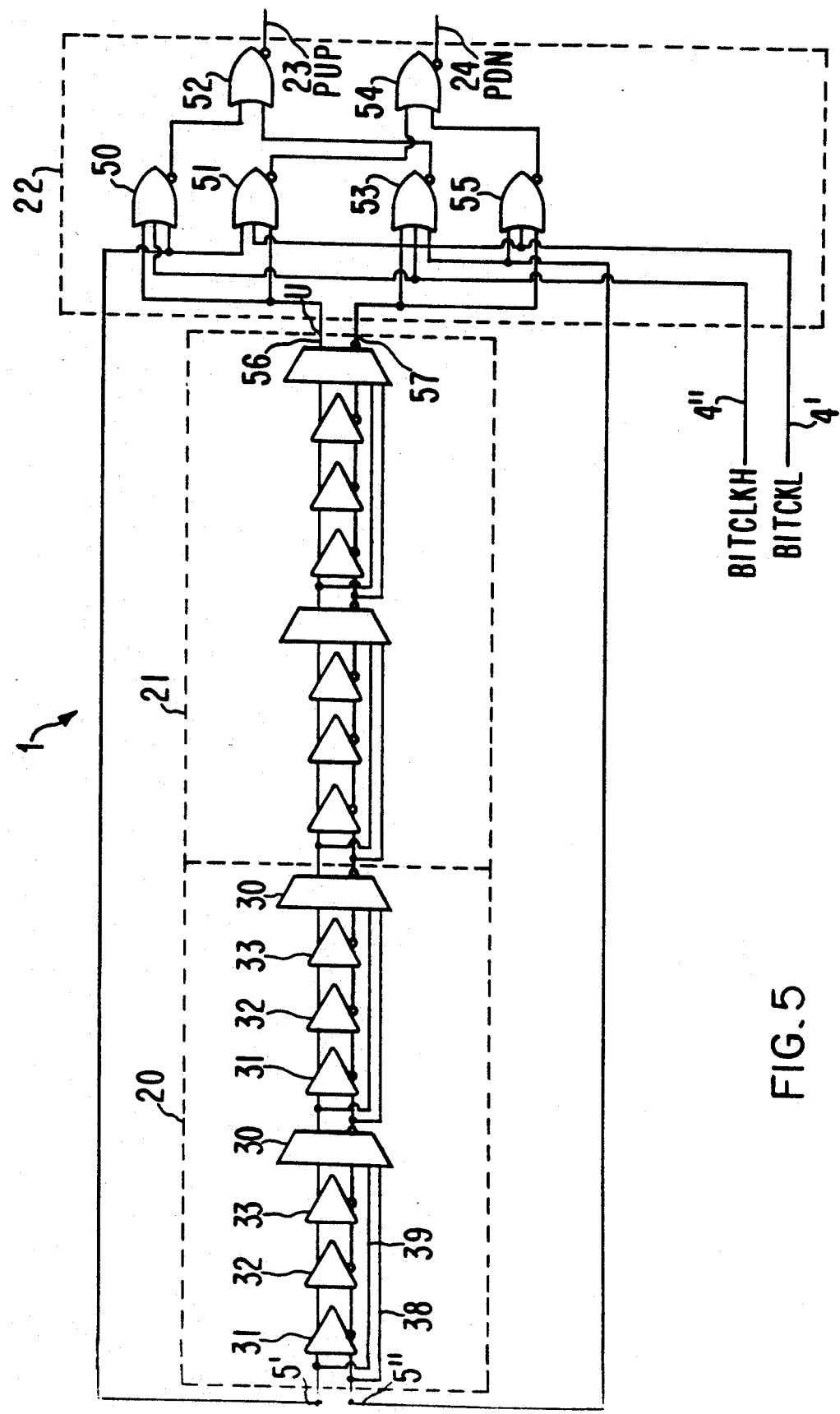
FIG. 5 is a schematic of an embodiment of our phase detector invention.

Combinatorial logic of circuit 22 combines the bit clock, the serial bit stream 5' and 5", and the U and V output 56 and 57 of the final delay unit to derive the phase detector outputs PUP and PDN as disclosed in FIG. 5.

FIG. 5 is the logic diagram for the complete phase detector 1 of this invention including the two unit delay stages 20 and 21 and the combinatorial logic 22 to derive the PUP 23 and PDN 24. The truth table for the combinatorial logic 22 is shown in Table I.

TABLE I

| U (56) | BitclkH | SerinH | PUP | PDN |
|--------|---------|--------|-----|-----|
| 0 | 0 | 0 | 0 | 1 |
| 0 | 0 | 1 | 1 | 1 |
| 0 | 1 | 0 | 1 | 0 |
| 0 | 1 | 1 | 1 | 1 |
| 1 | 0 | 0 | 1 | 1 |
| 1 | 0 | 1 | 0 | 1 |
| 1 | 1 | 0 | 1 | 1 |
| 1 | 1 | 1 | 1 | 0 |

Figure 6:
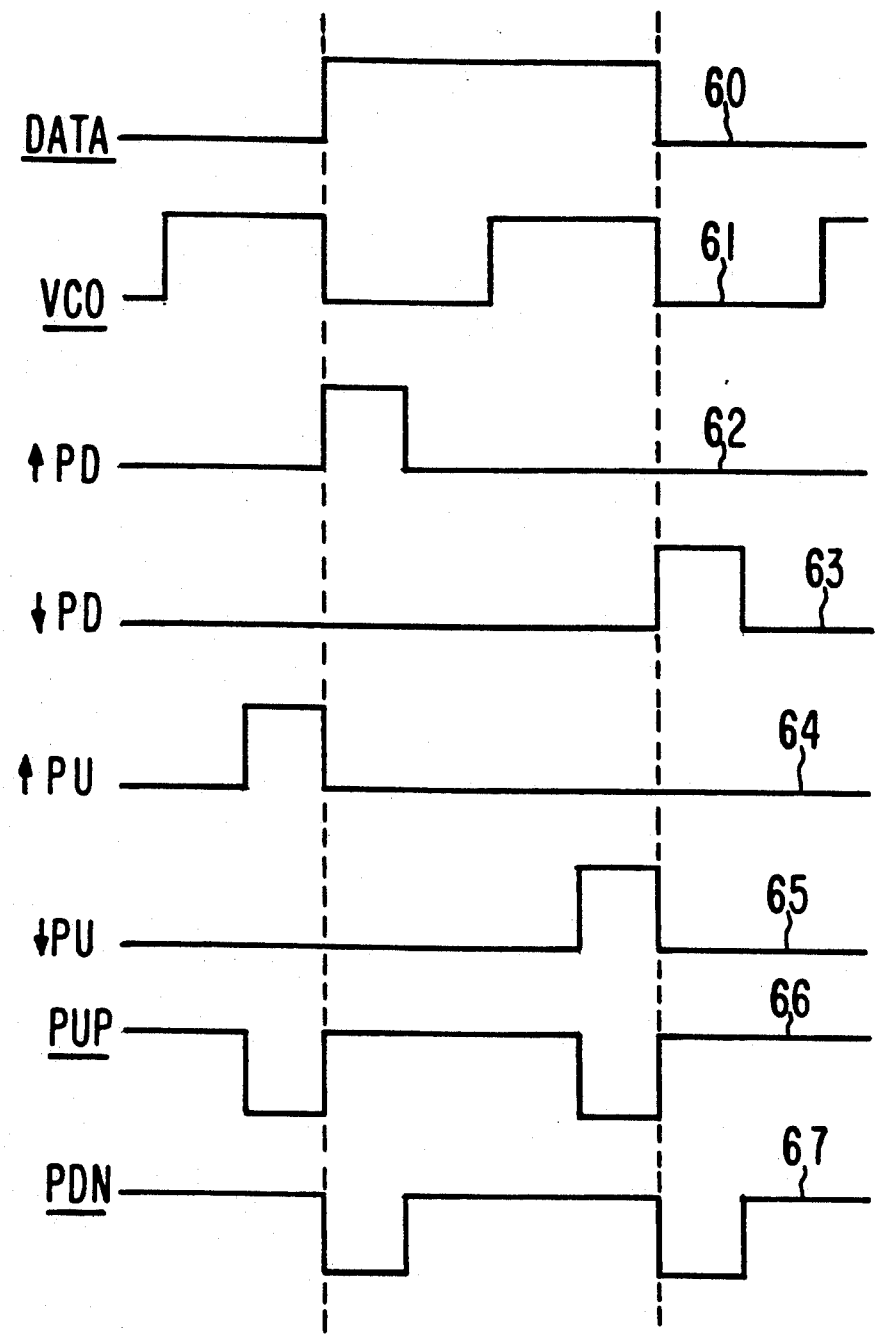
FIG. 6 is a timing diagram of the embodiment of FIG. 5.

With reference to the timing diagram of FIG. 6, the benefits of our invention become apparent. Curve 62 and 63 represents the time variation of the V output on line 57 of the unit time delay 21 and the output on lines 64 and 65 represent the U output pulses derived from line 56 output. The PUP and PDN pulses on lines 66 and 67 are the signals delivered to the filter 2, FIG. 2, which are used to correct the average voltage input to the VCO and the feedback to the phase detector. The essential and important feature of our invention is that the average of the sum of the time of PUP pulse and PDN pulse widths is one half of the VCO clock period, i.e., PUP+PDN always equals ½ of the clock period. This relationship is true for all frequencies over the entire large frequency range of operation of the VCO. The range of the phase detector of our invention is proportional to the ratio of the sum of pulse duration of PUP plus PDN to the time between the pulses. Since this ratio remains constant, the range is constant over frequency.

Figure 7:
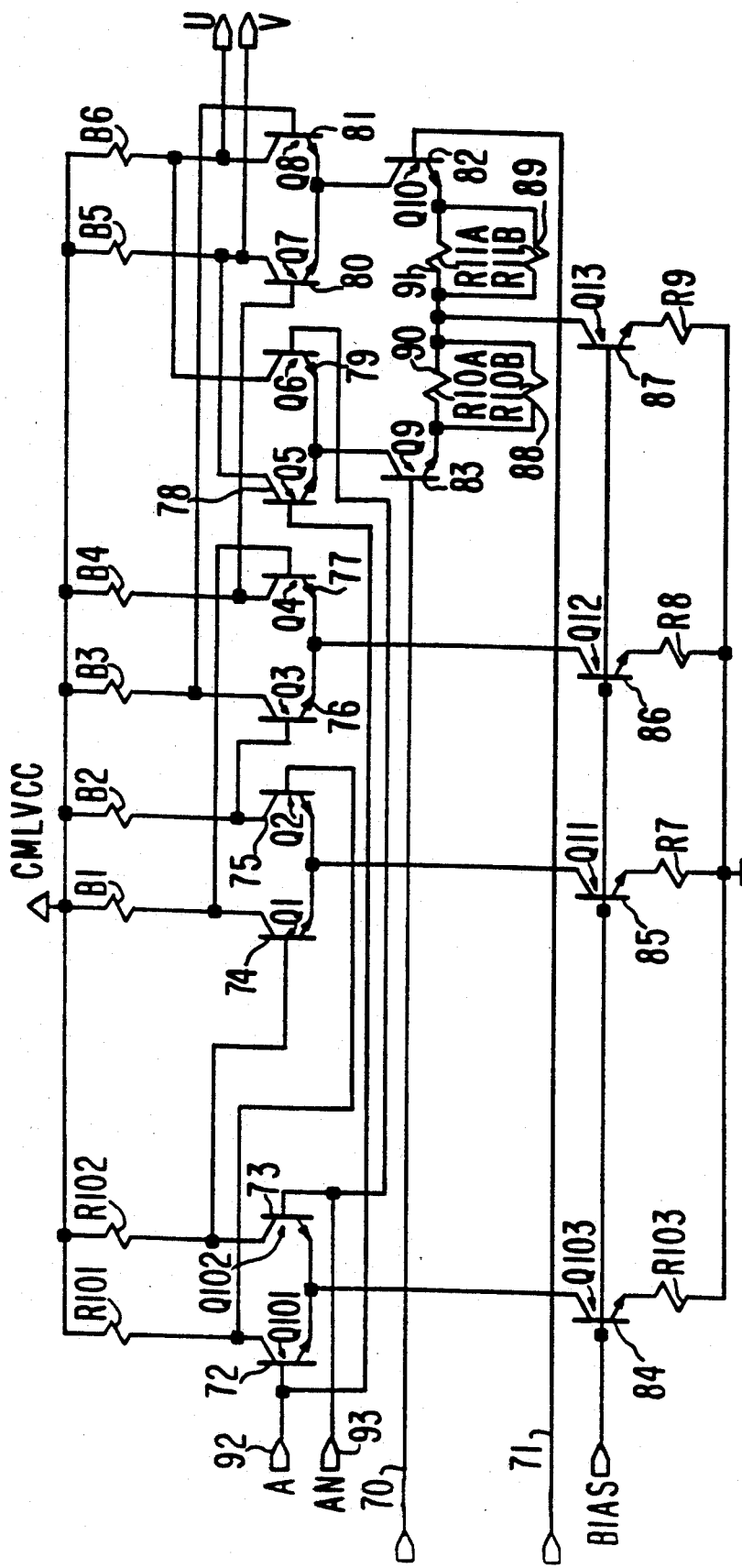
FIG. 7 is the circuit diagram of the unit delay of our phase detector.

The constructional schematic details of one half of the unit time delay is disclosed in FIG. 7 in a bipolar transistor implementation. The transistors Q101, Q102 and Q103 are the buffer logic element 31 of FIG. 5. Transistors Q1, Q2 and Q11 are the buffer 32 and transistors Q3, Q4 and Q12 are the buffer 33. Each buffer contributes a delay on the order of 1 (or less) nanoseconds. Transistors Q5, Q6, Q7, Q8, Q9, Q10 and Q13 are weighter/adder circuit 30. The voltage VC-VCN across Q9 and Q10 causes these two transistors to change the amount of the total current they share and accordingly control the time delay of the output waveforms U and V of the weighter/adder as explained in conjunction with FIG. 3 and FIG. 4.

It is noted that this invention is not restricted to the particular embodiment of the phase detector disclosed but is intended to be of a scope defined by the claims. Also, while the phase detector of this invention is not limited to use with any particular type of VCO, a ring oscillator type VCO employing multiple, differential pair circuits with variable current source delay units is the most straight forward. A ring oscillator can be conveniently combined with the phase detector of this invention especially where the delay units are made from the same unit time delay cell design as the type disclosed in conjunction with this invention.

We claim:

1. In a phase locked loop for synchronizing to a serial data bit stream including a VCO (voltage controlled oscillator) generating a bit clock, a phase detector for comparing said serial data bit stream to said bit clock and for passing an error signal to a low pass filter coupled to said phase detector, said low pass filter connected to said VCO for correcting the frequency of said VCO responsive to said filter output,
   means to also couple said low pass filter output back to said phase detector, and wherein said phase detector includes a time delay circuit responsive to said low pass filter output.

2. In a phase detector for a phase locked loop including a serially connected phase detector, low pass filter and VCO (voltage controlled oscillator), said phase detector comprising:
   first terminal means to receive a serial data bit stream;
   second terminal means to receive a bit clock from said VCO;
   third terminal means to receive an analogue voltage from said low pass filter;
   variable time delay means connected to said first terminal and being responsive to said analogue voltage from said low pass filter; and
   said phase detector having a constant gain region as a fixed percentage of frequency, said phase detector including means to generate a pump up pulse and a pump down pulse by combinatorial logic, the sum of the time duration of said pump up and pump down pulses being a constant percentage of the period of said bit clock over the entire frequency range of said VCO.

3. The phase detector of claim 2 wherein said means to generate a pump up and pump down pulse includes variable time delay means.

4. The phase detector of claim 3 wherein said variable time delay means includes means to perform a weighted addition of a first signal applied to a first port and a second signal applied to a second port, wherein said weighting is responsive to said variable analogue voltage from said low pass filter and said variable time delay means further includes means to output a variable width pulse being a function of said weighted addition.

5. The phase detector of claim 4 wherein said combinatorial logic input includes said serial bit stream, said bit clock and the said variable width pulse output of said variable time delay means.

6. The phase detector of claim 5 wherein said variable time delay comprises a plurality of unit delay circuits in series.

7. The phase detector of claim 6 wherein each said unit delay circuit comprises a first and second delay path, said first delay path being coupled through a plurality of active circuits, to said first port of said means to perform a weighted average, and said second delay path being coupled to said second port of said means to perform a weighted average.

8. The phase detector of claim 7 wherein said first delay path includes at least three active devices, each said active device contributing a delay on the order of 1 nanoseconds.

9. The phase detector of claim 2 wherein said combinatorial logic is a means to combine the instantaneous logic state of said bit clock, said serial data bit stream and said variable time delay means output.

10. A method for providing a variable delay of an input waveform comprising:
    inputting said input waveform to a first and second delay line in parallel;
    applying the output VD1 of said first delay line to a first port of an adder/weighter circuit;
    applying the output VD2 of said second delay line to a second port of said adder/weighter; said first output VD1 being delayed by time $t_d$ with respect to said second output VD2;
    weighting output VD1 by $\alpha$ to form $V_1$ in said adder/weighter circuit;
    weighting output VD2 by $(1-\alpha)$ to form $V_2$ in said adder/weighter circuit;
    adding $V_1+V_2$ to form $V_3$ in said adder/weighter; and
    outputting $V_3$, where $V_3$ is delayed with respect to said second output VD2 by $t_d(1-\alpha)$ wherein $\alpha$ is a variable weighting factor.

11. The method of claim 10 wherein said variable weighting factor, $\alpha$, is a feedback variable voltage provided from the output of a low pass filter in a phase locked loop which variable feedback voltage is a measure of the error between the clock rate of an input data stream and the frequency or phase of the VCO of said phase locked loop.

* * * * *